(12) United States Patent
Brask et al.

(10) Patent No.: US 7,045,428 B2
(45) Date of Patent: May 16, 2006

(54) METHOD FOR MAKING A SEMICONDUCTOR DEVICE WITH A HIGH-K GATE DIELECTRIC AND A CONDUCTOR THAT FACILITATES CURRENT FLOW ACROSS A P/N JUNCTION

(75) Inventors: Justin K. Brask, Portland, OR (US); Jack Kavalieros, Portland, OR (US); Mark L. Doczy, Beaverton, OR (US); Matthew V. Metz, Hillsboro, OR (US); Uday Shah, Portland, OR (US); Chris E. Barns, Portland, OR (US); Suman Datta, Beaverton, OR (US); Robert B. Turkot, Jr., Hillsboro, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 140 days.

(21) Appl. No.: 10/855,635

(22) Filed: May 26, 2004

(65) Prior Publication Data

US 2005/0266619 A1 Dec. 1, 2005

(51) Int. Cl.
*H01L 21/8234* (2006.01)
(52) U.S. Cl. ..................... 438/275; 438/199
(58) Field of Classification Search ................ 438/199, 438/216, 275, 287
See application file for complete search history.

(56) References Cited

U.S. PATENT DOCUMENTS

| | | | |
|---|---|---|---|
| 6,063,698 A | 5/2000 | Tseng et al. ................. | 438/585 |
| 6,184,072 B1 | 2/2001 | Kaushik et al. ............. | 438/197 |
| 6,255,698 B1 | 7/2001 | Gardner et al. ............. | 257/369 |
| 6,365,450 B1 | 4/2002 | Kim ........................... | 438/216 |
| 6,410,376 B1 | 6/2002 | Ng et al. ..................... | 438/199 |
| 6,420,279 B1 | 7/2002 | Ono et al. ................... | 438/785 |
| 6,475,874 B1 | 11/2002 | Xiang et al. ................ | 438/396 |
| 6,514,828 B1 | 2/2003 | Ahn et al. ................... | 438/240 |
| 6,544,906 B1 | 4/2003 | Rotondaro et al. ......... | 438/785 |
| 6,586,288 B1 | 7/2003 | Kim et al. ................... | 438/183 |
| 6,599,781 B1 * | 7/2003 | Li ............................... | 438/142 |
| 6,617,209 B1 | 9/2003 | Chau et al. ................. | 438/240 |
| 6,617,210 B1 | 9/2003 | Chau et al. ................. | 438/240 |

(Continued)

FOREIGN PATENT DOCUMENTS

EP 0 899 784 AZ 3/1999

(Continued)

OTHER PUBLICATIONS

Polishchuk et al., "Dual Workfunction CMOS Gate Technology Based on Metal Interdiffusion", www.eesc.berkeley.edu, 1 page.

(Continued)

*Primary Examiner*—George Fourson
*Assistant Examiner*—Fernando L. Toledo
(74) *Attorney, Agent, or Firm*—Michael D. Plimier

(57) ABSTRACT

A method for making a semiconductor device is described. That method comprises forming on a substrate a first gate dielectric layer that has a first substantially vertical component, then forming a first metal layer on the first gate dielectric layer. After forming on the substrate a second gate dielectric layer that has a second substantially vertical component, a second metal layer is formed on the second gate dielectric layer. In this method, a conductor is formed that contacts both the first metal layer and the second metal layer.

20 Claims, 2 Drawing Sheets

U.S. PATENT DOCUMENTS

| | | | | |
|---|---|---|---|---|
| 6,620,713 | B1 | 9/2003 | Arghavani et al. | 438/585 |
| 6,653,698 | B1* | 11/2003 | Lee et al. | 257/407 |
| 6,689,675 | B1 | 2/2004 | Parker et al. | 438/585 |
| 6,696,327 | B1 | 2/2004 | Brask et al. | 438/197 |
| 6,696,345 | B1 | 2/2004 | Chau et al. | 438/387 |
| 6,872,613 | B1* | 3/2005 | Xiang et al. | 438/199 |
| 2002/0058374 | A1 | 5/2002 | Kim et al. | 438/228 |
| 2002/0197790 | A1 | 12/2002 | Kizilyalli et al. | 438/240 |
| 2003/0032303 | A1 | 2/2003 | Yu et al. | 438/770 |
| 2003/0045080 | A1 | 3/2003 | Visokay et al. | 438/591 |
| 2003/0211680 | A1* | 11/2003 | Arghavani et al. | 438/200 |
| 2005/0035409 | A1* | 2/2005 | Ko et al. | 257/350 |
| 2005/0054149 | A1* | 3/2005 | Xiang et al. | 438/199 |
| 2005/0136632 | A1* | 6/2005 | Rotondaro et al. | 438/591 |

FOREIGN PATENT DOCUMENTS

| | | | |
|---|---|---|---|
| GB | 2 358 737 A | 4/2001 | |

OTHER PUBLICATIONS

Doug Barlage et al., "High-Frequency Response of 100nm Integrated CMOS Transistors with High-K Gate Dielectrics", 2001 IEEE, 4 pages.

Lu et al., "Dual-Metal Gate Technology for Deep-Submicron CMOS Devices", dated Apr. 29, 2003, 1 page.

Schwantes et al., "Performance Improvement of Metal Gate CMOS Technologies with Gigabit Feature Sizes", Technical University of Hanburg-Harburg, 5 pages.

Doczy et al., "Integrating N-type and P-type Metal Gate Transistors," U.S. Appl. No. 10/327,293, Filed Dec. 20, 2002.

Brask et al., "A Method for Making a Semiconductor Device Having a High-K Gate Dielectric", U.S. Appl. No. 10/652,796, filed Aug. 28, 2003.

Brask et al., "A Method for Making a Semiconductor Device Having a Metal Gate Electrode," U.S. Appl. No. 10/704,497, Filed Nov. 6, 2003.

Brask et al., "A Method for Etching a Thin Metal Layer", U.S. Appl. No. 10/704,498, Filed Nov. 6, 2003.

Brask et al., "A Method for Making a Semiconductor Device with a Metal Gate Electrode that is Formed on an Annealed High-K Gate Dielectric Layer", U.S. Appl. No. 10/742,678, Filed Dec. 19, 2003.

Brask et al., "A Method for Making a Semiconductor Device that Includes a Metal Gate Electrode", U.S. Appl. No. 10/739,173, filed Dec. 18, 2003.

Brask et al., "A CMOS Device With Metal and Silicide Gate Electrodes and a Method for Making It", U.S. Appl. No. 10/748,559, filed Dec. 29, 2003.

Doczy et al., "A Method for Making a Semiconductor Device that Includes a Metal Gate Electrode", U.S. Appl. No. 10/748,545, Filed Dec. 29, 2003.

Ahah et al., "A Method for Making a Semiconductor Device with a Metal Gate Electrode," U.S. Appl. No. 10/805,880, filed Mar. 22, 2004.

Shah et al., "A Replacement Gte Process for Making a Semiconductor Device that Includes a Metal Gate Electrode," U.S. Appl. No. 10/809,853, filed Mar. 24, 2004.

Brask et al., "A Method for Making a Semiconductor Device Having a High-K Gate Dielectric Layer and a Metal Gate Electrode," U.S. Appl. No. 10/828,958, Filed Apr. 20, 2004.

Metz et al., "A Method for Making A Semiconductor Device Having a High-K Gate Dielectric Layer and A Metal Gate Electrode", Serial No. Unknown, filed May 4, 2004.

\* cited by examiner

METHOD FOR MAKING A SEMICONDUCTOR DEVICE WITH A HIGH-K GATE DIELECTRIC AND A CONDUCTOR THAT FACILITATES CURRENT FLOW ACROSS A P/N JUNCTION

FIELD OF THE INVENTION

The present invention relates to methods for making semiconductor devices, in particular, semiconductor devices with high-k gate dielectric layers and metal gate electrodes.

BACKGROUND OF THE INVENTION

MOS field-effect transistors with very thin gate dielectrics made from silicon dioxide may experience unacceptable gate leakage currents. Forming the gate dielectric from certain high-k dielectric materials, instead of silicon dioxide, can reduce gate leakage. Because, however, such a dielectric may not be compatible with polysilicon, it may be desirable to use metal gate electrodes in devices that include high-k gate dielectrics.

When making a CMOS device that includes metal gate electrodes, a replacement gate process may be used to form gate electrodes from different metals. In that process, a first polysilicon layer, bracketed by a pair of spacers, is removed to create a trench between the spacers. The trench is filled with a first metal. A second polysilicon layer is then removed, and replaced with a second metal that differs from the first metal.

In certain devices, e.g., SRAMs, n-type and p-type metal layers contact each other at a P/N junction. For such devices to function properly, current must flow across that junction. When a replacement gate process is used to form such a device, however, the dielectric layers upon which the metal layers are deposited may impede current flow between those metal layers. Such a process may impede current flow if those dielectric layers form on the sidewalls of the trenches, which receive the metal layers, in addition to forming on the trench floors. When forming on the trench sidewalls, the dielectric layers may act as an insulator that hinders current flow from one metal layer, which is positioned on one side of the dielectric layers, to another metal layer, which is positioned on the other side of the dielectric layers.

Accordingly, there is a need for a replacement gate process that enables current flow between metal layers that are initially separated by substantially vertical portions of dielectric layers upon which the metal layers are formed. The method of the present invention provides such a process.

Features shown in these figures are not intended to be drawn to scale.

DETAILED DESCRIPTION OF THE PRESENT INVENTION

A method for making a semiconductor device is described. That method comprises forming first and second gate dielectric layers on a substrate. The first gate dielectric layer and the second gate dielectric layer each have a substantially vertical component. A first metal layer is formed on the first gate dielectric layer, a second metal layer is formed on the second gate dielectric layer, and a conductor is formed that contacts both the first metal layer and the second metal layer. In the following description, a number of details are set forth to provide a thorough understanding of the present invention. It will be apparent to those skilled in the art, however, that the invention may be practiced in many ways other than those expressly described here. The invention is thus not limited by the specific details disclosed below.

Figure 1A:
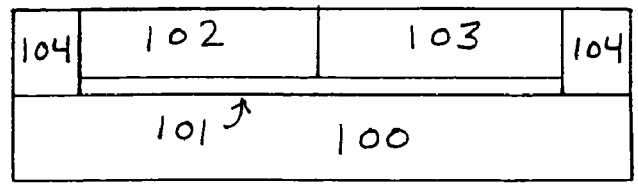
FIGS. 1a–1f represent cross-sections of structures that may be formed when using a replacement gate process to make a semiconductor device.

FIGS. 1a–1f illustrate structures that may be formed, when using a replacement gate process to make a semiconductor device. FIG. 1a represents an intermediate structure that may be created when using such a process to make a device that will include a P/N junction where first and second metal layers meet. In this embodiment, that structure includes dielectric layer 101, which is formed on substrate 100, and first and second polysilicon layers 102 and 103, which are formed on dielectric layer 101. Dielectric 104 borders polysilicon layers 102 and 103.

Substrate 100 may comprise a bulk silicon or silicon-on-insulator substructure. Alternatively, substrate 100 may comprise other materials—which may or may not be combined with silicon—such as: germanium, indium antimonide, lead telluride, indium arsenide, indium phosphide, gallium arsenide, or gallium antimonide. Although a few examples of materials from which substrate 100 may be formed are described here, any material that may serve as a foundation upon which a semiconductor device may be built falls within the spirit and scope of the present invention.

Dielectric layer 101 may comprise silicon dioxide, or another material that may insulate substrate 100 from other substances. First and second polysilicon layers 102 and 103 preferably are between about 100 and about 2,000 angstroms thick, and more preferably are between about 500 and about 1,600 angstroms thick. Both of those layers may be undoped or doped with similar substances. Alternatively, one layer may be doped, while the other is not doped, or one layer may be doped n-type (e.g., with arsenic, phosphorus or another n-type material), while the other is doped p-type (e.g., with boron or another p-type material). Dielectric 104 may comprise silicon dioxide, or a low-k material. Dielectric 104 may be undoped or doped with phosphorus, boron, or other elements, and may be formed using a high density plasma deposition process.

Conventional process steps, materials, and equipment may be used to generate the FIG. 1a structure, as will be apparent to those skilled in the art. Although in this embodiment dielectric layer 101 and polysilicon layers 102 and 103 are formed on substrate 100, other materials may be used in their place—as long as they may be selectively removed to generate structures like those described below. As shown, dielectric 104 has been polished back, e.g., via a conventional chemical mechanical polishing ("CMP") operation, to expose first and second polysilicon layers 102 and 103. Although not shown, the FIG. 1a structure may include other features that may be formed using conventional processes (e.g., sidewall spacers, which may comprise silicon nitride, that are formed between dielectric 104 and polysilicon layers 102 and 103).

After forming the FIG. 1a structure, first polysilicon layer 102 is removed. In a preferred embodiment, a wet etch process that is selective for layer 102 over second polysilicon layer 103 is applied to remove layer 102 without removing significant portions of layer 103. If first polysilicon layer 102 is doped n-type, and second polysilicon layer 103 is doped p-type (e.g., with boron), such a wet etch process may comprise exposing first polysilicon layer 102 to an aqueous solution that comprises a source of hydroxide for a sufficient time at a sufficient temperature to remove substantially all of layer 102. That source of hydroxide may comprise between about 2 and about 30 percent ammonium hydroxide or a tetraalkyl ammonium hydroxide, e.g., tetramethyl ammonium hydroxide ("TMAH"), by volume in deionized water.

First polysilicon layer 102 may be selectively removed by exposing it to a solution, which is maintained at a temperature between about 15° C. and about 90° C. (and preferably below about 40° C.), that comprises between about 2 and about 30 percent ammonium hydroxide by volume in deionized water. During that exposure step, which preferably lasts at least one minute, it may be desirable to apply sonic energy at a frequency of between about 10 KHz and about 2,000 KHz, while dissipating at between about 1 and about 10 watts/cm$^2$.

In a particularly preferred embodiment, a polysilicon layer with a thickness of about 1,350 angstroms may be selectively removed by exposing it at about 25° C. for about 30 minutes to a solution that comprises about 15 percent ammonium hydroxide by volume in deionized water, while applying sonic energy at about 1,000 KHz—dissipating at about 5 watts/cm$^2$. Such an etch process should remove substantially all of an n-type polysilicon layer without removing a meaningful amount of a p-type polysilicon layer.

As an alternative, first polysilicon layer 102 may be selectively removed by exposing it for at least one minute to a solution, which is maintained at a temperature between about 60° C. and about 90° C., that comprises between about 20 and about 30 percent TMAH by volume in deionized water, while applying sonic energy. Removing a polysilicon layer with a thickness of about 1,350 angstroms by exposing it at about 80° C. for about 2 minutes to a solution that comprises about 25 percent TMAH by volume in deionized water (while applying sonic energy at about 1,000 KHz, dissipating at about 5 watts/cm$^2$) may remove substantially all of that layer without removing a significant amount of layer 103. Dielectric layer 101 should be sufficiently thick to prevent the etchant that is applied to remove first polysilicon layer 102 from reaching the underlying substrate.

Figure 1B:
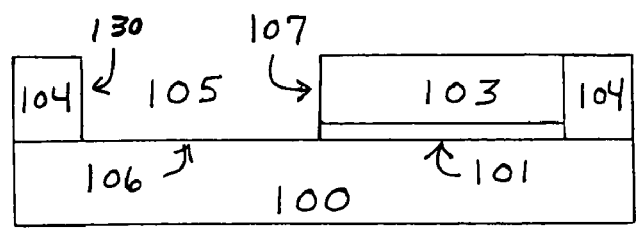

After removing first polysilicon layer 102, the underlying portion of dielectric layer 101 is removed to generate first trench 105, as FIG. 1b illustrates. First trench 105 includes first floor 106 and first side 107. If dielectric layer 101 comprises silicon dioxide, it may be removed using an etch process that is selective for silicon dioxide. Such an etch process may comprise exposing layer 101 to a solution that includes about 1 percent HF in deionized water. Layer 101 should be exposed for a limited time, as the etch process for removing that layer may also remove part of dielectric 104. With that in mind, if a 1 percent HF based solution is used to remove layer 101, the device preferably should be exposed to that solution for less than about 60 seconds, and more preferably for about 30 seconds or less.

Figure 1C:
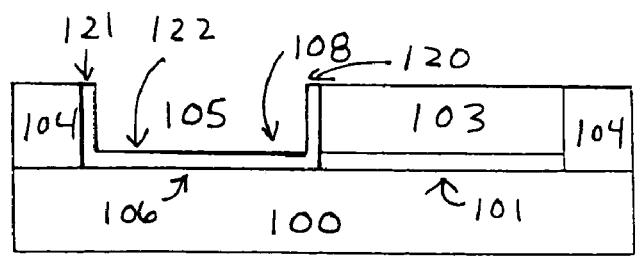

After removing part of dielectric layer 101, first gate dielectric layer 108 is formed on substrate 100 within first trench 105, generating the FIG. 1c structure. Although first gate dielectric layer 108 may comprise any material that may serve as a gate dielectric upon which a metal layer may be formed, first gate dielectric layer 108 preferably comprises a high-k dielectric material. Some of the materials that may be used to make a high-k gate dielectric include: hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, and aluminum oxide. Although a few examples of materials that may be used to form a high-k gate dielectric layer are described here, that layer may be made from other materials.

In this embodiment, first high-k gate dielectric layer 108 may be formed within first trench 105 using a conventional atomic layer chemical vapor deposition ("ALCVD") process. In such a process, a metal oxide precursor (e.g., a metal chloride) and steam may be fed at selected flow rates into an ALCVD reactor, which is then operated at a selected temperature and pressure to generate an atomically smooth interface between substrate 100 and first high-k gate dielectric layer 108. The ALCVD reactor should be operated long enough to form a layer with the desired thickness. In most applications, first high-k gate dielectric layer 108 should be less than about 60 angstroms thick, and more preferably between about 5 angstroms and about 40 angstroms thick.

As shown in FIG. 1c, when an ALCVD process is used to form first high-k gate dielectric layer 108, that layer will form on sides 107 and 130 of first trench 105 in addition to forming on first floor 106 of first trench 105. In this respect, first high-k gate dielectric layer 108 comprises substantially vertical components 120 and 121, and a substantially horizontal component 122.

In the illustrated embodiment, first metal layer 109 is formed directly on layer 108 to fill first trench 105. First metal layer 109 may comprise an n-type metal. Materials that may be used to form n-type metal layer 109 include: hafnium, zirconium, titanium, tantalum, aluminum, and their alloys, e.g., metal carbides that include these elements, i.e., hafnium carbide, zirconium carbide, titanium carbide, tantalum carbide, and aluminum carbide.

Figure 1D:
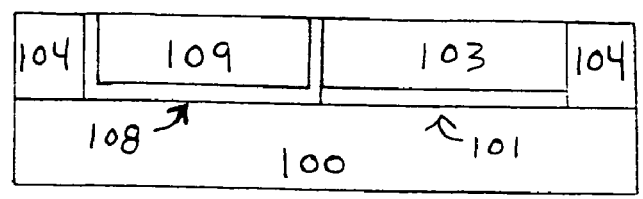

N-type metal layer 109 may be formed on first high-k gate dielectric layer 108 using well known physical vapor deposition ("PVD") or chemical vapor deposition ("CVD") processes, e.g., conventional sputter or atomic layer CVD processes. Although an n-type metal layer may be initially deposited over the entire device, FIG. 1d illustrates the structure that results after n-type metal layer 109 has been removed except where it fills first trench 105. Layer 109 may be removed from other portions of the device using an appropriate CMP operation—dielectric 104 serving as a polish stop.

N-type metal layer 109 preferably has a workfunction that is between about 3.9 eV and about 4.2 eV, preferably is between about 100 angstroms and about 2,000 angstroms thick, and more preferably is between about 500 angstroms and about 1,600 angstroms thick. Although FIG. 1d represents a structure in which n-type metal layer 109 completely fills first trench 105, in alternative embodiments, n-type metal layer 109 may fill only part of first trench 105, with the remainder of the trench being filled with a material that may be easily polished, e.g., tungsten, aluminum, titanium, or titanium nitride. In such an alternative embodiment, n-type metal layer 109 preferably is between about 25 and about 300 angstroms thick.

In the illustrated embodiment, after forming n-type metal layer 109 within first trench 105, second polysilicon layer 103 is removed. As indicated above, if first polysilicon layer 102 is n-type, then second polysilicon layer 103 preferably is p-type. In a preferred embodiment, p-type layer 103 is exposed to a solution that comprises between about 20 and about 30 percent TMAH by volume in deionized water for a sufficient time at a sufficient temperature (e.g., between about 60° C. and about 90° C.), while applying sonic energy, to remove all of layer 103 without removing significant portions of n-type metal layer 109.

Figure 1E:
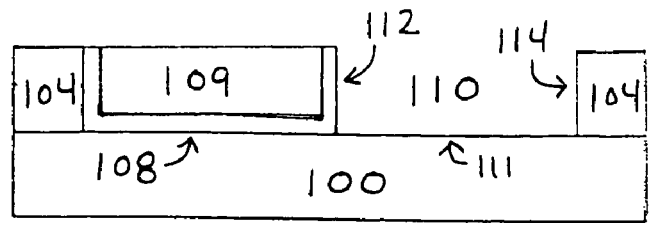

After removing second polysilicon layer 103, the underlying part of dielectric layer 101 is removed to generate the FIG. 1e structure. When dielectric layer 101 comprises silicon dioxide, this portion of dielectric layer 101 may be removed by exposing it, for a limited time, to a solution that includes about 1 percent HF in deionized water—as described above. Removal of dielectric layer 101 creates second trench 110. Second trench 110 includes second floor 111 and second side 112. Second gate dielectric layer 113 is then formed within second trench 110. In a preferred embodiment, second gate dielectric layer 113 comprises a second high-k gate dielectric layer, which is formed using a conventional ALCVD process. Like first high-k gate dielectric layer 108, second high-k gate dielectric layer 113, when formed using such a process, will form on sides 112 and 114 of second trench 110 in addition to forming on second floor 111 of second trench 110. Also like first high-k gate dielectric layer 108, second high-k gate dielectric layer 113 comprises substantially vertical components along sides 112 and 114, and a substantially horizontal component along second floor 111.

Figure 1F:
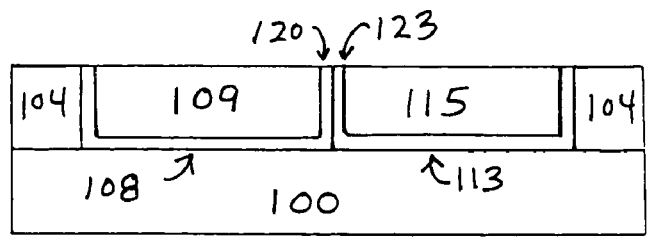

In this embodiment, after replacing layer 101 with layer 113, second metal layer 115 is formed directly on layer 113 to fill second trench 110 and to generate the FIG. 1f structure. Second metal layer 115 may comprise a p-type metal. Materials that may be used to form p-type metal layer 115 include: ruthenium, palladium, platinum, cobalt, nickel, and conductive metal oxides, e.g., ruthenium oxide. P-type metal layer 115 may be formed on second high-k gate dielectric layer 113 using well known PVD or CVD processes. As shown in FIG. 1f, p-type metal layer 115 has been removed, e.g., by applying an appropriate CMP operation, except where it fills second trench 110. P-type metal layer 115 may have a workfunction that is between about 4.9 eV and about 5.2 eV, and may be between about 100 angstroms and about 2,000 angstroms thick. Like n-type metal layer 109, in this embodiment p-type metal layer 115 preferably is between about 500 angstroms and about 1,600 angstroms thick.

Although FIG. 1f represents a structure in which p-type metal layer 115 completely fills second trench 110, in alternative embodiments, p-type metal layer 115 may fill only part of second trench 110. As with n-type metal layer 109, the remainder of second trench 110 may be filled with a material that may be easily polished, e.g., tungsten, aluminum, titanium, or titanium nitride. In such an alternative embodiment, p-type metal layer 115 preferably is between about 25 and about 300 angstroms thick. Although this embodiment illustrates forming an n-type metal layer prior to forming a p-type metal layer, alternative embodiments may form a p-type metal layer prior to forming an n-type metal layer.

In the FIG. 1f structure, first substantially vertical component 120 of first high-k gate dielectric layer 108 and second substantially vertical component 123 of second high-k gate dielectric layer 113 form a dielectric barrier between first metal layer 109 and second metal layer 115. That barrier may inhibit current flow between those metal layers. In the method of the present invention, enhanced current flow—across a P/N junction where first metal layer 109 and second metal layer 115 meet—is enabled by forming a conductor that contacts both first metal layer 109 and second metal layer 115.

In one embodiment, such a conductor may be formed by converting at least part of first substantially vertical component 120 and at least part of second substantially vertical component 123 to a metal. When first high-k gate dielectric layer 108 and second high-k gate dielectric layer 113 each comprise a metal oxide, part of first substantially vertical component 120 and part of second substantially vertical component 123 may be reduced to a metal using a conventional reduction operation.

Figure 2:
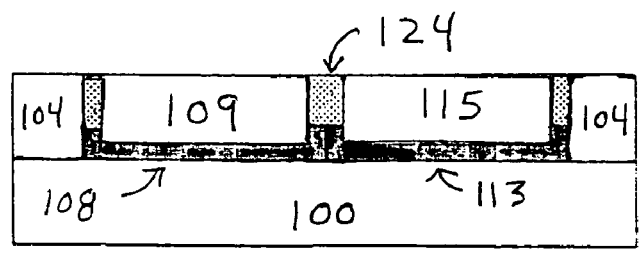
FIG. 2 represents a cross-section of a structure that may be formed when part of the dielectric layers shown in FIG. 1f are reduced to a metal.

Parts of components 120 and 123 may be converted into a metal to generate conductor 124, as FIG. 2 illustrates, via a chemical reduction process that uses conventional equipment, materials, and operating conditions. In such a chemical reduction process, a metal oxide (e.g., hafnium oxide, zirconium oxide, aluminum oxide, or any of the other metal oxides identified above) may be converted to its metallic state (e.g., hafnium, zirconium, or aluminum) by exposing the metal oxide to hydrogen, which may be contained in a hydrogen containing gas or a hydrogen based plasma.

When a hydrogen containing gas is used, it may consist essentially of hydrogen, or, alternatively, may include hydrogen and an inert gas, e.g., helium or argon. When included in an inert gas, the hydrogen containing gas should comprise about 5% hydrogen. Prior to exposing components 120 and 123 to such a hydrogen containing gas, the reaction chamber should be purged to prevent undesirable reaction between those components and oxygen or nitrogen. The reduction process may take place under ambient conditions. The amount of components 120 and 123 that is reduced to metal may depend upon the amount of hydrogen that is fed into the reactor.

When a metal oxide is reduced to a metal by exposing it to a hydrogen based plasma, a direct plasma enhanced chemical vapor deposition ("PECVD") process or a remote plasma enhanced chemical vapor deposition ("RPECVD") process may be used. In such a PECVD or RPECVD process, the metal oxide may be reduced to a metal by exposing it to hydrogen and to certain ionized species generated by a plasma source. When a PECVD process is used, such ionized species may be generated by feeding hydrogen and an inert gas into the reactor, then striking a plasma within the reactor. When a RPECVD process is used, the plasma may be stricken remotely, followed by feeding the resulting ionized species and hydrogen (or a mixture of hydrogen and an inert gas) into the reactor—downstream from the plasma source. The reactor should be operated under the appropriate conditions (e.g., temperature, pressure, radio frequency, power, and flow rates) for a sufficient time to reduce the desired amount of components 120 and 123 to a metal that may serve as a conductor between layers 109 and 115.

Although a few examples of processes that may be used to reduce parts of components 120 and 123 of high-k gate dielectric layers 108 and 113 to a metal are described here, other reducing operations may be used, as will be apparent to those skilled in the art. Examples include other types of wet or dry chemical reducing processes, e.g., those that use aqueous solutions or plasmas with different reducing agents. As an alternative to such chemical reduction processes, an electrochemical reduction operation may be used. In such a process, the device is placed into a chemical bath. By passing an electric current through the bath, part of a metal oxide may be reduced to a metal. Various combinations of these processes may also be employed.

Processes that may be used to reduce parts of components 120 and 123 to a metal are not limited to those described above. This embodiment of the method of the present invention contemplates using any suitable reduction operation that removes oxygen from at least part of those components.

Figure 3:
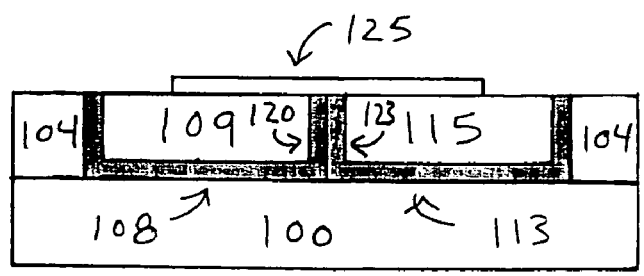
FIG. 3 represents a cross-section of a structure that may be formed when a metal strip is formed on the FIG. 1f structure to connect metal layers.

In another embodiment, a conductor that contacts both first metal layer 109 and second metal layer 115 may be generated by forming a metal strip that is positioned on at least part of first metal layer 109 and on at least part of second metal layer 115. As shown in FIG. 3, such a metal strip may cover first substantially vertical component 120 and second substantially vertical component 123 in addition to contacting metal layers 109 and 115.

Metal strip 125 may comprise any of the metals identified above, as well as many others that may serve as a conductor between layers 109 and 115, as will be apparent to those skilled in the art. Metal strip 125 may be formed using conventional metal deposition and patterning processes. The desired thickness for metal strip 125 may vary depending upon device characteristics and the overall process for making it.

The method described above may enable a replacement gate process to be used to form a device (e.g., an SRAM) that requires n-type and p-type metal layers to contact each other at a P/N junction, and that facilitates adequate current flow across that junction. Although the embodiments described above provide examples of processes for forming such a device, the present invention is not limited to these particular embodiments.

Although the foregoing description has specified certain steps and materials that may be used in the present invention, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method for making a semiconductor device comprising:
   forming a first gate dielectric layer on a substrate, the first gate dielectric layer having a first substantially vertical component;
   forming a first metal layer on the first gate dielectric;
   forming a second gate dielectric layer on the substrate, the second gate dielectric layer having a second substantially vertical component in contact with the first substantially vertical component of the first gate dielectric layer;
   forming a second metal layer on the second gate dielectric layer; and
   forming a conductor that contacts both the first metal layer and the second metal layer.

2. The method of claim 1 wherein the first gate dielectric layer comprises a first high-k gate dielectric layer and the second gate dielectric layer comprises a second high-k gate dielectric layer.

3. The method of claim 2 wherein the first high-k gate dielectric layer and the second high-k gate dielectric layer each comprise a material that is selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

4. The method of claim 1 wherein the first metal layer comprises a material that is selected from the group consisting of hafnium, zirconium, titanium, tantalum, aluminum, and a metal carbide, and the second metal layer comprises a material that is selected from the group consisting of ruthenium, palladium, platinum, cobalt, nickel, and a conductive metal oxide.

5. The method of claim 1 wherein the first metal layer comprises a material that is selected from the group consisting of ruthenium, palladium, platinum, cobalt, nickel, and a conductive metal oxide and the second metal layer comprises a material that is selected from the group consisting of hafnium, zirconium, titanium, tantalum, aluminum, and a metal carbide.

6. The method of claim 1 wherein the first and second metal layers are each between about 25 and about 300 angstroms thick, the first metal layer has a workfunction that is between about 3.9 eV and about 4.2 eV, and the second metal layer has a workfunction that is between about 4.9 eV and about 5.2 eV.

7. The method of claim 1 wherein the first and second metal layers are each between about 25 and about 300 angstroms thick, the first metal layer has a workfunction that is between about 4.9 eV and about 5.2 eV, and the second metal layer has a workfunction that is between about 3.9 eV and about 4.2 eV.

8. The method of claim 1 wherein the conductor is formed by converting at least part of the first substantially vertical component and at least part of the second substantially vertical component to a metal.

9. The method of claim 1 wherein the conductor comprises a metal strip that is positioned on at least part of the first metal layer and on at least part of the second metal layer.

10. The method of claim 9 wherein the metal strip covers the first substantially vertical component and the second substantially vertical component.

11. A method for making a semiconductor device comprising:
    forming a first dielectric layer on a substrate;
    forming a first trench within the first dielectric layer, the first trench having a first floor and a first side;
    forming a first high-k gate dielectric layer within the first trench, the first high-k gate dielectric layer having a first part that is formed on the first floor and a second part that is formed along the first side;
    forming a first metal layer on the first high-k gate dielectric layer;
    forming a second trench within the first dielectric layer, the second trench having a second floor and a second side;
    forming a second high-k gate dielectric layer within the second trench, the second high-k gate dielectric layer having a first part that is formed on the second floor and a second part that is formed along the second side, the second part of the second high-k gate dielectric layer being in contact with the second part of the first high-k gate dielectric layer;

forming a second metal layer on the second high-k gate dielectric layer;

reducing an upper portion of the second part of the first high-k gate dielectric layer to a metal; and reducing an upper portion of the second part of the second high-k gate dielectric layer to a metal.

12. The method of claim 11 wherein the upper portion of the second part of the first high-k gate dielectric layer is reduced to a metal at the same time that the upper portion of the second part of the second high-k gate dielectric layer is reduced to a metal.

13. The method of claim 11 wherein the first high-k gate dielectric layer and the second high-k gate dielectric layer each comprise a material that is selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

14. The method of claim 11 wherein the first and second metal layers are each between about 25 and about 300 angstroms thick, the first metal layer has a workfunction that is between about 3.9 eV and about 4.2 eV and comprises a material that is selected from the group consisting of hafnium, zirconium, titanium, tantalum, aluminum, and a metal carbide, and the second metal layer has a workfunction that is between about 4.9 eV and about 5.2 eV and comprises a material that is selected from the group consisting of ruthenium, palladium, platinum, cobalt, nickel, and a conductive metal oxide.

15. The method of claim 11 wherein the first and second metal layers are each between about 25 and about 300 angstroms thick, the first metal layer has a workfunction that is between about 4.9 eV and about 5.2 eV and comprises a material that is selected from the group consisting of ruthenium, palladium, platinum, cobalt, nickel, and a conductive metal oxide and the second metal layer has a workfunction that is between about 3.9 eV and about 4.2 eV and comprises a material that is selected from the group consisting of hafnium, zirconium, titanium, tantalum, aluminum, and a metal carbide.

16. A method for making a semiconductor device comprising:

forming a first dielectric layer on a substrate;

forming a first trench within the first dielectric layer, the first trench having a first floor and a first side;

forming a first high-k gate dielectric layer within the first trench, the first high-k gate dielectric layer having a first part that is formed on the first floor and a second part that is formed along the first side;

forming a first metal layer on the first high-k dielectric layer;

forming a second trench within the first dielectric layer, the second trench having a second floor and a second side; forming a second high-k gate dielectric layer within the second trench, the second high-k gate dielectric layer having a first part that is formed on the second floor and a second part that is formed along the second side, the second part of the second high-k gate dielectric layer being in contact with the second part of the first high-k gate dielectric layer.

17. The method of claim 16 wherein the metal strip covers the second part of the first high-k gate dielectric layer and the second part of the second high-k gate dielectric layer.

18. The method of claim 16 wherein the first high-k gate dielectric layer and the second high-k gate dielectric layer each comprise a material that is selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

19. The method of claim 16 wherein the first and second metal layers are each between about 25 and about 300 angstroms thick, the first metal layer has a workfunction that is between about 3.9 eV and about 4.2 eV and comprises a material that is selected from the group consisting of hafnium, zirconium, titanium, tantalum, aluminum, and a metal carbide, and the second metal layer has a workfunction that is between about 4.9 eV and about 5.2 eV and comprises a material that is selected from the group consisting of ruthenium, palladium, platinum, cobalt, nickel, and a conductive metal oxide.

20. The method of claim 16 wherein the first and second metal layers are each between about 25 and about 300 angstroms thick, the first metal layer has a workfunction that is between about 4.9 eV and about 5.2 eV and comprises a material that is selected from the group consisting of ruthenium, palladium, platinum, cobalt, nickel, and a conductive metal oxide and the second metal layer has a workfunction that is between about 3.9 eV and about 4.2 eV and comprises a material that is selected from the group consisting of hafnium, zirconium, titanium, tantalum, aluminum, and a metal carbide.

* * * * *